(12) United States Patent
Wu et al.

(10) Patent No.: US 8,283,781 B2
(45) Date of Patent: Oct. 9, 2012

(54) SEMICONDUCTOR DEVICE HAVING PAD STRUCTURE WITH STRESS BUFFER LAYER

(75) Inventors: Wei-Cheng Wu, Hsinchu (TW); Shang-Yun Hou, Jubei (TW); Shin-Puu Jeng, Hsinchu (TW); Tzuan-Horng Liu, Logtan Township (TW); Tzu-Wei Chiu, Hsinchu (TW); Chao-Wen Shih, Zhubei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 70 days.

(21) Appl. No.: 12/879,512

(22) Filed: Sep. 10, 2010

(65) Prior Publication Data

US 2012/0061823 A1    Mar. 15, 2012

(51) Int. Cl.
*H01L 29/40* (2006.01)
(52) U.S. Cl. ......... 257/738; 257/E23.021; 257/E23.069; 257/737; 438/612; 438/613

(58) Field of Classification Search .................. 257/737, 257/738, E23.021, E23.068, E23.069, 780, 257/781, E32.021; 438/612–617
See application file for complete search history.

(56) References Cited

U.S. PATENT DOCUMENTS

| | | | |
|---|---|---|---|
| 5,943,597 A | 8/1999 | Kleffner et al. | |
| 5,977,632 A * | 11/1999 | Beddingfield | 257/737 |
| 6,462,426 B1 | 10/2002 | Kelkar et al. | |
| 7,863,739 B2 * | 1/2011 | Lee et al. | 257/737 |

* cited by examiner

*Primary Examiner* — Jasmine Clark
(74) *Attorney, Agent, or Firm* — Lowe Hauptman Ham & Berner, LLP

(57) ABSTRACT

A semiconductor device has a pad structure with a ring-shaped stress buffer layer between a metal pad and an under-bump metallization (UBM) layer. The stress buffer layer is formed of a dielectric layer with a dielectric constant less than 3.5, a polymer layer, or an aluminum layer. The stress buffer layer is a circular ring, a square ring, an octagonal ring, or any other geometric ring.

20 Claims, 11 Drawing Sheets

SEMICONDUCTOR DEVICE HAVING PAD STRUCTURE WITH STRESS BUFFER LAYER

TECHNICAL FIELD

This disclosure relates to semiconductor devices, and more particularly, to semiconductor devices having pad structures with stress buffer layers.

BACKGROUND

Modern integrated circuits are made up of literally millions of active devices such as transistors and capacitors. These devices are initially isolated from each other, but are later interconnected together to form functional circuits. Typical interconnect structures include lateral interconnections, such as metal lines (wirings), and vertical interconnections, such as vias and contacts. Interconnections are increasingly determining the limits of performance and the density of modern integrated circuits. On top of the interconnect structures, bond pads are formed and exposed on the surface of the respective chip. Electrical connections are made through bond pads to connect the chip to a package substrate or another die. Bond pads can be used for wire bonding or flip-chip bonding. Wafer level chip scale packaging (WLCSP) is currently widely used for its low cost and relatively simple processes. In a typical WLCSP, interconnect structures are formed on metallization layers, followed by the formation of under-bump metallurgy (UBM), and the mounting of solder balls.

Flip-chip packaging utilizes bumps to establish electrical contact between a chip's I/O pads and the substrate or lead frame of the package. Structurally, a bump actually contains the bump itself and a so-called under bump metallurgy (UBM) located between the bump and an I/O pad. A UBM generally contains an adhesion layer, a barrier layer and a wetting layer, arranged in this order on the I/O pad. The bumps themselves, based on the material used, are classified as solder bumps, gold bumps, copper pillar bumps and bumps with mixed metals. Recently, copper interconnect post technology is proposed. Instead of using solder bump, the electronic component is connected to a substrate by means of copper post. The copper interconnect post technology achieves finer pitch with minimum probability of bump bridging, reduces the capacitance load for the circuits and allows the electronic component to perform at higher frequencies. A solder alloy is still necessary for capping the bump structure and jointing electronic components as well.

The physical stresses in WLCSP and related flip-chip packages depend upon a combination of several factors, such as device size, architecture, and operating conditions, as well as the actual package design and materials of construction. However, the use of low-k materials makes a critical issue of the stress imposed on the device by the package. Also, the introduction of Cu post induces a higher stress than solder bump does, which requires a stress buffer or re-distribution layer. Polyimide (PI) can act a stress buffer to reduce the maximum stress at the low-k dielectric layer under the metal bump region, but adversely impacts the device performance. For example, the PI layer needs a high-temperature and long-time curing process, which causes a large volume PI shrinkage to induce a great residual stress to silicon. The common failure mode is delamination or cracking around the die corner or the interface between the PI layer and an underfill material.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

Figure 1:
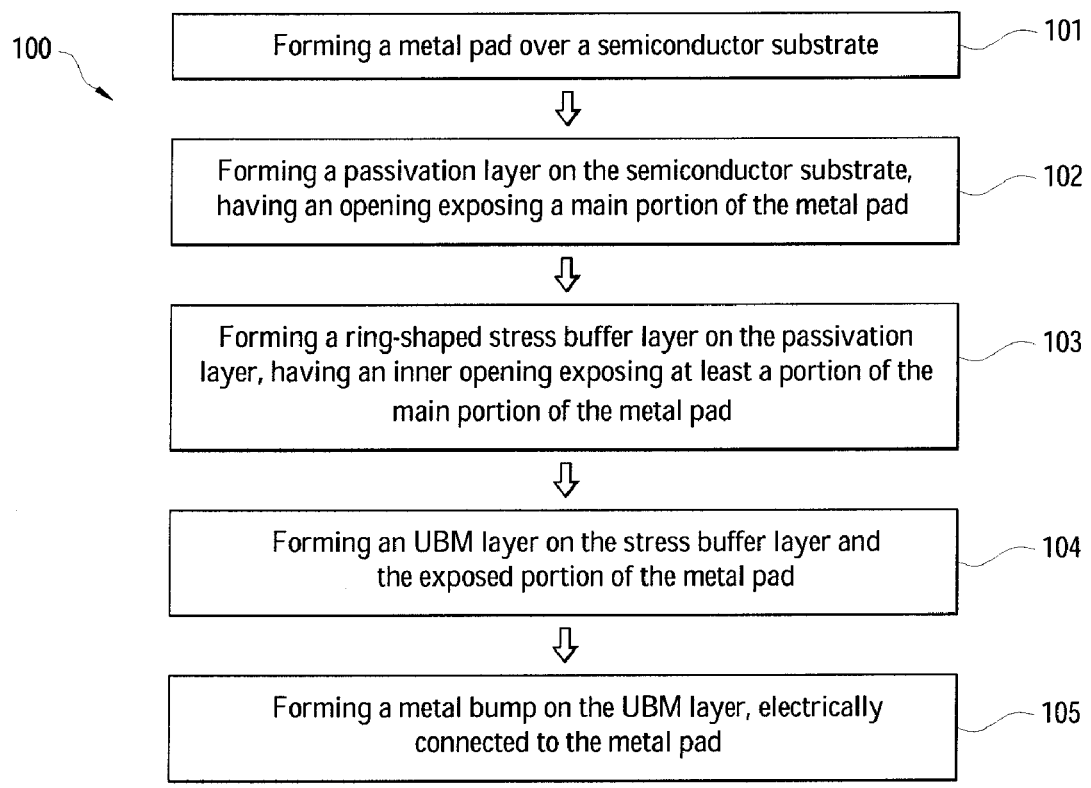
FIG. 1 is a flowchart of a method for fabricating a semiconductor device with a metal bump according to various aspects of the present disclosure.

This disclosure provides embodiments of semiconductor devices having pad structures with stress buffer layers and processes of forming the same. The semiconductor devices can have Cu post, post passivation interconnects, solder bump, and/or through-silicon vias (TSVs) fabricated thereon, applied to flip-chip assembly, wafer-level chip scale package (WLCSP), three-dimensional integrated circuit (3D-IC) stack, and/or any advanced package technology fields. Reference will now be made in detail to exemplary embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, apparatus in accordance with the present disclosure. It is to be understood that elements not specifically shown or described may take various forms well known to those skilled in the art. Further, when a layer is referred to as being on another layer or "on" a substrate, it may be directly on the other layer or on the substrate, or intervening layers may also be present. Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Illustrated in FIG. 1 is a flowchart of a method 100 for fabricating a semiconductor device according to various aspects of the present disclosure. Referring to FIG. 1, the method 100 begins with block 101 in which a metal pad is formed over a semiconductor substrate. The method 100 continues with block 102 in which a passivation layer is formed on the semiconductor substrate. The passivation layer is patterned to form an opening that exposes a main portion of the metal pad. The method 100 continues with block 103 in which a stress buffer layer is formed on the passivation layer.

The stress buffer layer is patterned as a ring-shaped layer to have an inner opening that exposes at least a portion of the main portion of the metal pad. The method 100 continues with block 104 in which an under-bump metallization (UBM) layer is formed on the stress buffer layer, the passivation layer and the exposed portion of the metal pad. The method 100 continues with block 105 in which a metal bump is formed on the UBM layer so as to electrically connect the metal bump to the metal pad.

FIGS. 2-6 are cross-sectional views of a portion of a semiconductor device at various stages of its fabrication according to one or more embodiments of the method 100 of FIG. 1.

Figure 2:
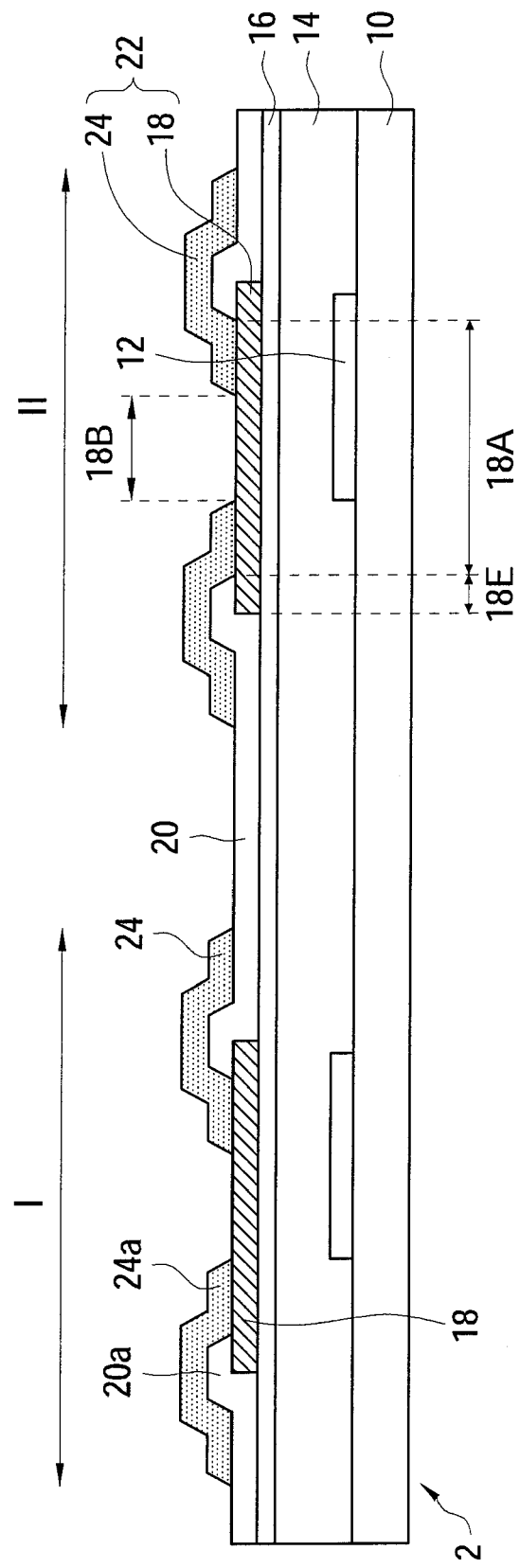
FIGS. 2-6 are cross-sectional views of a portion of a wafer at various stages of its fabrication according to an embodiment of the method of FIG. 1.

With reference to FIG. 2, there is shown a cross-sectional diagram of a wafer 2. The wafer 2 includes a semiconductor substrate 10 that is employed in a semiconductor integrated circuit fabrication, and integrated circuits may be formed therein and/or thereupon. The semiconductor substrate 10 is defined to mean any construction comprising semiconductor materials, including, but is not limited to, bulk silicon, a semiconductor wafer, a silicon-on-insulator (SOI) substrate, or a silicon germanium substrate. Other semiconductor materials, including group III, group IV, and group V elements, may also be used. The substrate 10 may further comprise a plurality of isolation features (not shown), such as shallow trench isolation (STI) features or local oxidation of silicon (LOCOS) features. The isolation features may define and isolate various microelectronic elements 12. Examples of the various microelectronic elements 12 that may be formed in the substrate 10 include transistors (e.g., metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), etc.); resistors; diodes; capacitors; inductors; fuses; or other suitable elements. Various processes are performed to form the various microelectronic elements including deposition, etching, implantation, photolithography, annealing, or other suitable processes. The microelectronic elements 12 are interconnected to form the integrated circuit device, such as a logic device, memory device (e.g., static random access memory or SRAM), radio frequency (RF) device, input/output (I/O) device, system-on-chip (SoC) device, combinations thereof, or other suitable types of devices. In alternative embodiments, the wafer 2 is an interposer wafer or a wafer of package substrates, and is substantially free from integrated circuit devices including transistors, resistors, capacitors, inductors, and/or the like, formed therein. In these embodiments, the substrate 10 may be formed of a semiconductor material, a dielectric material (such as silicon oxide) or a glass material.

FIG. 2 also shows an interconnect structure 14 and a first passivation layer 16 formed over the semiconductor substrate 10. The interconnect structure 14 includes metal lines and vias (not shown) formed therein and electrically coupled to semiconductor devices 12. The metal lines and vias may be formed of copper or copper alloys, and may be formed using damascene processes. Interconnect structure 14 includes at least one of inter-layer dielectric (ILD) layers and inter-metal dielectric (IMD) layers. In some embodiments, the ILD layer or the IMD layer includes silicon oxide, silicon nitride, silicon oxynitride, or low-k dielectric materials. The first passivation layer 16 formed on the interconnect structure 14 is a dielectric material layer that may be formed of low-k dielectric materials, un-doped silicate glass (USG), silicon nitride, silicon oxynitride, or other commonly used materials. The dielectric constants (k value) of the low-k dielectric materials may be less than about 3.9, or less than about 2.8.

A metal pad material is deposited on the first passivation layer 16, and then patterned to become a plurality of metal pads 18 in different bump regions I and II. At least one of the metal pads 18 may be electrically connected to the underlying interconnect structure 14. At least one of the metal pads 18 may be electrically coupled to the semiconductor devices 12, for example, through the underlying interconnection structure 14. In some embodiments, the metal pads 28 include aluminum (Al), copper (Cu), silver (Ag), gold (Au), nickel (Ni), tungsten (W), alloys thereof, and/or multi-layers thereof. Then a second passivation layer 20 is formed on the wafer 2, which is patterned to have openings 20*a* exposing the underlying metal pads 18 respectively. In one bump region I or II, the second passivation layer 20 exposes a main portion 18A of the metal pad 18. In some embodiments, the second passivation layer 20 may cover the edge portion 18E of the metal pad 18. The second passivation layer 20 is formed of a polymer layer, such as an epoxy, polyimide, benzocyclobutene (BCB), polybenzoxazole (PBO), or the like, although other relatively soft, often organic, dielectric materials can also be used. In some alternative embodiments, the second passivation layer 20 is formed of a non-organic material selected from un-doped silicate glass (USG), silicon nitride, silicon oxynitride, silicon oxide, or combinations thereof.

Next, a buffering material is deposited on the wafer 2 and then patterned to become a plurality of stress buffer layers 24 in bump regions I and II. The stress buffer layers 24 are separated from each other. In one bump region I or II, the stress buffer layer 24 covers portions of the second passivation layer 20 and metal pad 18, and exposes a portion 18B of the main portion 18A of the metal pad 18. The stress buffer layer 24 is a ring having an inner opening 24*a*. In some embodiments, the inner opening 24*a* is positioned within the opening 20*a* and has a diameter smaller than that of the opening 20*a*, thus the exposed portion 18B is smaller than the main portion 18A of the metal pad 18. In some embodiments, the inner opening 24*a* is positioned within the opening 20*a* and has a diameter larger than or equal to that of the opening 20*a*, thus the exposed portion 18B is substantially equal to the main portion 18A. In one bump region, the combination of the metal pad 18 and the stress buffer layer 24 serves as a pad structure 22 for electrically connecting an external terminal.

In at least some of the embodiments, the selection of a buffering material is based on a parameter such as the dielectric constant of the material, or the tensile strength, elongation to break, or Young's modulus of the materials. In some embodiments, the stress buffer layer 24 is formed of dielectric materials, such low-k dielectric materials with a dielectric constant (k) less than 3.5, un-doped silicate glass (USG), or fluorinated silica glass (FSG). In some embodiments, the stress buffer layer 24 is formed of polymer materials, such as polyimide (PI), benzocyclobutene (BCB), polybenzoxazole (PBO), or epoxy. In some embodiments, the stress buffer layer is formed of a metal layer, such as aluminum (Al) or copper (Cu).

Figure 3A:
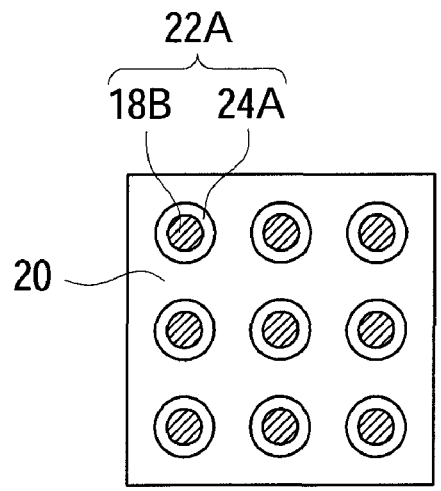
Figure 3B:
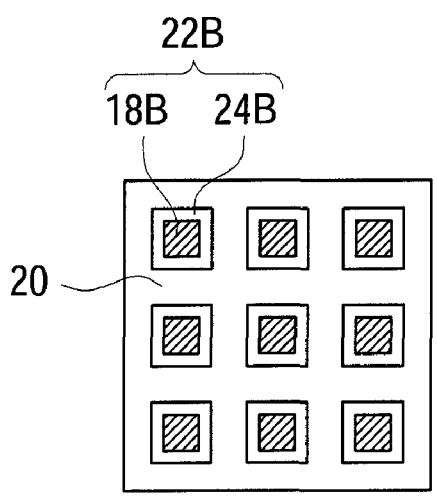
Figure 3C:
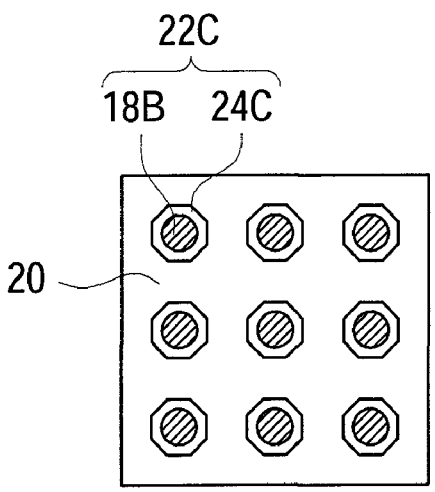

An overhead view of the embodiment as shown in FIG. 2 is depicted in FIGS. 3A-3C. A number of stress buffer layers 24 can be seen arranged on the second passivation layer 20. In the illustrative embodiment, the stress buffer layers 24 are ring-shaped layers which are separated from each other and located in bump regions respectively. The stress buffer layer 24 can be any geometric ring-shaped layer. In some embodiments, as illustrated in FIG. 3A, the pad structure 22A includes the stress buffer layers 24A formed of circular rings. In some embodiments, as illustrated in FIG. 3B, the pad structure 22B includes the stress buffer layers 24B formed of square rings. In some embodiments, as illustrated in FIG. 3C, the pad structure 22C includes the stress buffer layers 24C formed of octagonal rings. Further embodiments not described or shown here may have other shapes, such as ovals, other regular polygons, or irregular polygons. Combinations of shapes on the same wafer, e.g., a wafer containing ring, square and polygonal ring-shaped stress buffer layers, are possible in further embodiments. The ring-shaped stress buffer layers 24 may extend just a few microns from the edge of the second passivation layer 20. The stress buffer layer 24 has a thickness between about 2 and 10 microns in some embodiments.

Figure 4:
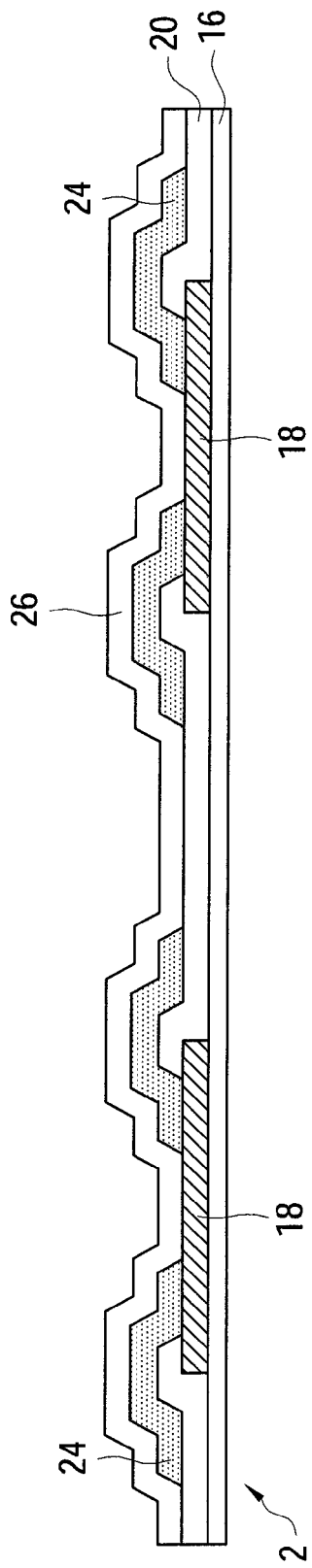

Next, with reference to FIG. 4, an under-bump-metallurgy (UBM) layer 26 is formed on the wafer 2 to cover the second passivation layer 20, the stress buffer layers 24 and the exposed portions 18B of the metal pads 18. In some embodiments, the UBM layer 26 includes a diffusion barrier layer or a glue layer, formed of titanium, tantalum, titanium nitride, tantalum nitride, or the like deposited by physical vapor deposition (PVD) or sputtering to a thickness of between about 500 and 2000 angstrom (Å). In some embodiments, the UBM layer 26 includes a seed layer formed on the diffusion barrier layer, deposited by physical vapor deposition (PVD) or sputtering to a thickness of between about 500 and 10000 Å. The seed layer may be formed of copper or copper alloys that include silver, chromium, nickel, tin, gold, or combinations thereof.

Figure 5:
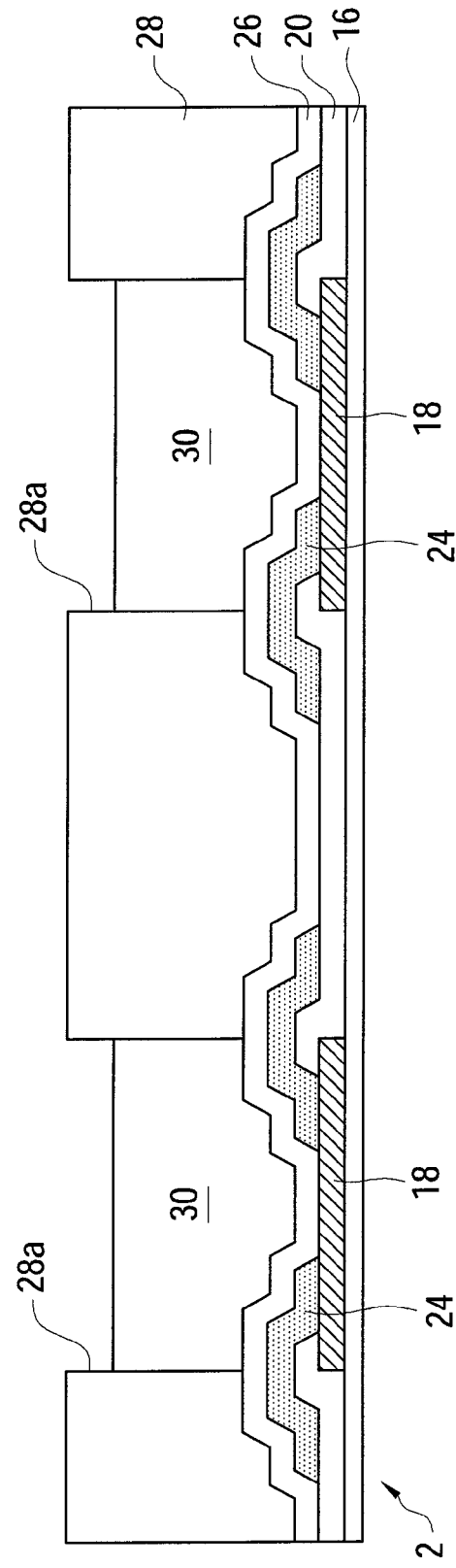

Then a mask layer 28 is formed on the UBM layer 26 as shown in FIG. 5. The mask layer 28 is patterned to form openings 28a therein so as to expose portions of the UBM layer 26 in different bump regions. The mask layer 28 may be a dry film or a photoresist film, which may be patterned by lithography and/or etching processes. FIG. 5 also shows the formation of a conductive material with solder wettability in the openings 28a. In an embodiment, copper (Cu) layers 30 are formed in the openings 28a respectively to contact the underlying UBM layer 26. As used throughout this disclosure, the term "copper (Cu) layer" is intended to include substantially a layer including pure elemental copper, copper containing unavoidable impurities, or copper alloys containing minor amounts of elements such as tantalum, indium, tin, zinc, manganese, chromium, titanium, germanium, strontium, platinum, magnesium, aluminum, or zirconium. The formation methods may include sputtering, printing, electro plating, electroless plating, or chemical vapor deposition (CVD) methods. For example, electro-chemical plating (ECP) is carried out to form the Cu layer 30. In an embodiment, the thickness of the Cu layer 30 is greater than 25 µm. In another embodiment, the thickness of the Cu layer 30 is greater than 40 µm. For example, the Cu layer 30 is about 40-50 µm thick, or about 40-70 µm thick, although the thickness may be greater or smaller.

Figure 6:
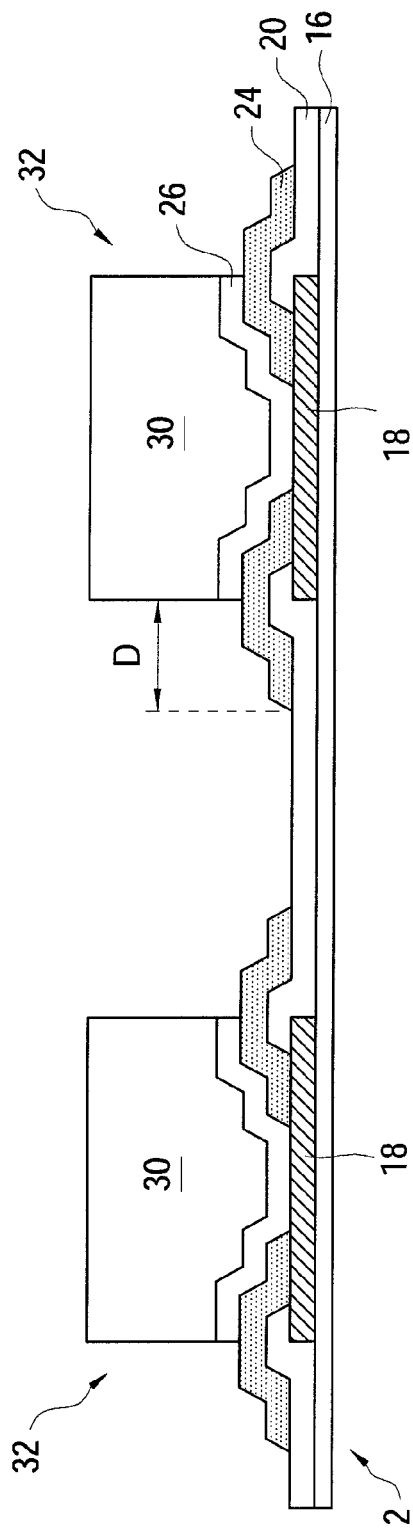

Thereafter, as shown in FIG. 6, the mask layer 28 is removed from the UBM layer 26, and thereby the sidewall surfaces the Cu layers 30 are exposed. The Cu layer 30 protruding from the UBM layer 26 is referred to as a Cu post 30 hereinafter. The process proceeds with the step of etching the exposed portions of the UBM layer 26 using the Cu posts 30 as the mask, thus portions of the second passivation layer 20 and stress buffer layers 24 outside the Cu posts 30 are exposed.

This completes a plurality of bump structures 32 in different bump regions I and II on the wafer 2. In one bump region I or II, the bump structure 32 includes the Cu post 30, the UBM layer 26 covered by the Cu post 30, and the pad structure 22 underlying the UBM layer 26. The pad structure 22 includes the metal pad 18 and the ring-shaped stress buffer layer 24, in which the second passivation layer 20 is formed there between. The passivation layer 20 covers the edge portion 18E of the metal pad 18 and exposes the main portion 18A of the metal pad 18. The ring-shaped stress buffer layer 24 formed on the second passivation layer 20 exposes the portion 18B of the exposed main portion 18A. Thus, the UBM layer 26 formed on the metal pad 18 can contact the exposed portion 18B of the metal pad 18. The ring-shaped stress buffer layers 24 may extend a distance D from the edge of the UBM layer 26. In some embodiments, the distance D is around 5 to 15 microns. Alternatively, the ring-shaped stress buffer layers 24 could be measured as extending around 5 to 15 microns from an outer edge of the metal pad 18. The wafer 2 is then sawed and packaged onto a package substrate, or another die, with solder balls or Cu bumps mounted on a pad on the package substrate or the other die.

The present disclosure discloses the pad structure 22 with the ring-shaped stress buffer layer 24 over the metal pad 18. The ring-shaped stress buffer layers 24 are located in bump regions respectively, which are separated from each other. Compared with an approach of using a polyimide layer with a large coverage area on the wafer, the ring-shaped stress buffer layer 24 has a smaller size and extends a smaller distance from the edge of the UBM layer, which can reduce a great residual stress and relieve external stress loading via the bump caused by a thermal mismatch or temperature cycles. Although a copper post places additional stress on a silicon chip when compared to a tin/lead solder bump, by localizing the ring-shaped stress buffer layers to the bump regions, thicker stress buffers can be used without corresponding compressive or tensile loads being unnecessarily placed on the silicon substrate.

Figure 7:
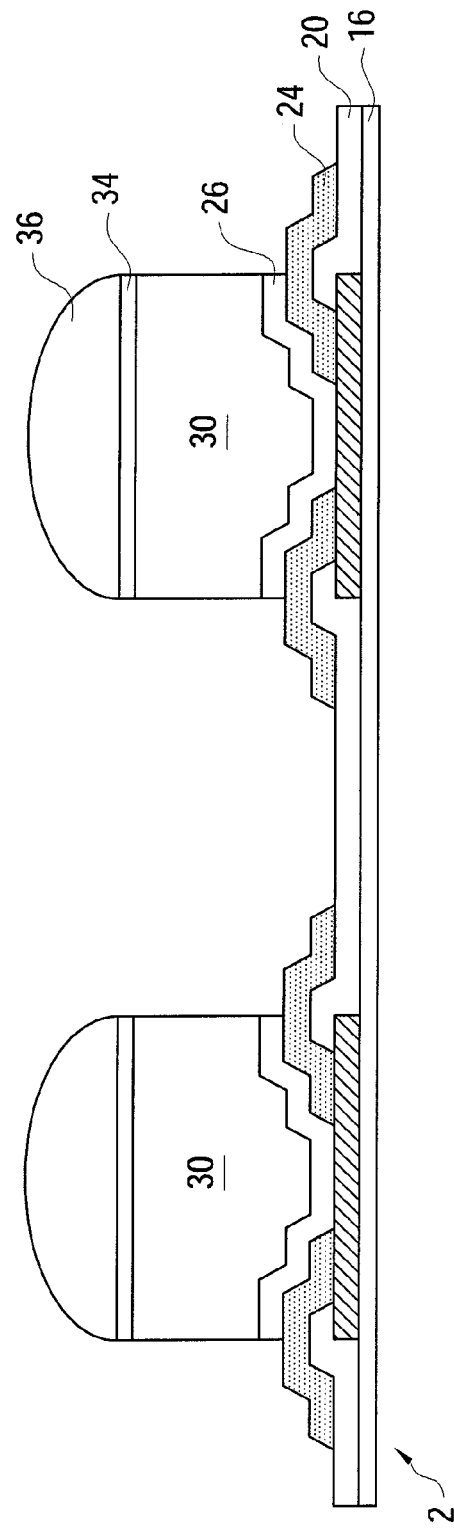
FIG. 7 is a cross-sectional views of a portion of a wafer of its fabrication according to an embodiment of the method of FIG. 1.

FIG. 7 is a cross-sectional view of a portion of a wafer during fabrication of the wafer according to an embodiment of the method of FIG. 1. The explanation of the same or similar portions to the description in FIGS. 2-6 will be omitted. There is shown a cap layer 34 formed on the top surface of the Cu post 30 and a solder layer 36 formed on the cap layer 34. The layers 34 and 36 are deposited on the Cu layer 30 successively before removing the mask layer 28, and remain on the Cu posts 30 after the UBM etching process. The cap layer 34 acts as a barrier layer to prevent copper in the Cu post from diffusing into bonding material, such as solder alloy, which is used to bond the substrate 10 to external features. The prevention of copper diffusion increases the reliability and bonding strength of the package. The cap layer 34 may include nickel (Ni), tin, tin-lead (SnPb), gold (Au), silver, palladium (Pd), indium (In), nickel-palladium-gold (NiPdAu), nickel-gold (NiAu), other similar materials, or alloys deposited by plating methods. The cap layer 34 has a thickness about 1-10 µm. In some embodiments, the cap layer 34 is formed of Ni, Au, Pd, Ni-based alloy, Au-based alloy, Pd-based alloy, or combinations thereof. In some embodiments, the solder layer 36 is made of Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, or SnAgSb, etc., formed by a plating processes. In one embodiment, the solder layer 36 is a lead-free solder layer. For a lead-free solder system, the solder layer is SnAg with Ag content being controlled lower than 3.0 weight percent (wt %). For example, the lead-free solder layer is SnAg with Ag content being controlled at about 2.5 weight percent (wt %). A reflowing process may be performed on the solder layer 36 to form a solder ball on the cap layer 34.

Figure 8:
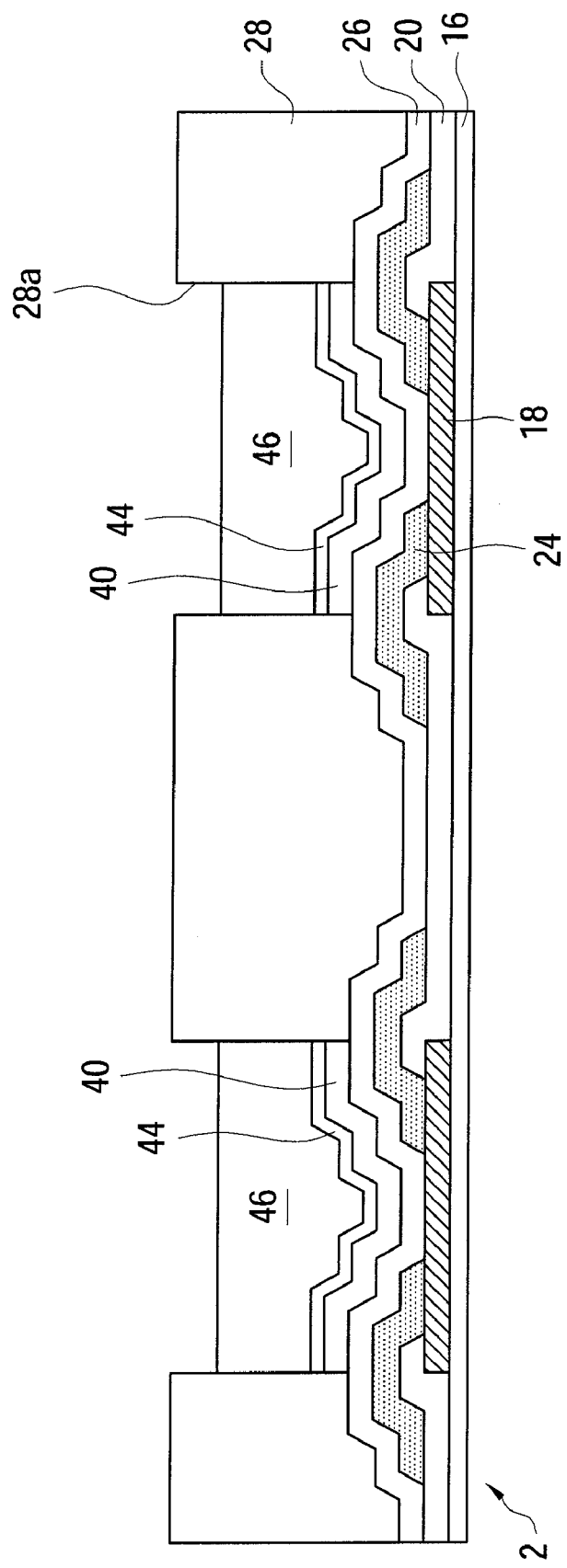
FIGS. 8-9 are cross-sectional views of a portion of a wafer at various stages of its fabrication according to an embodiment of the method of FIG. 1.
Figure 9:
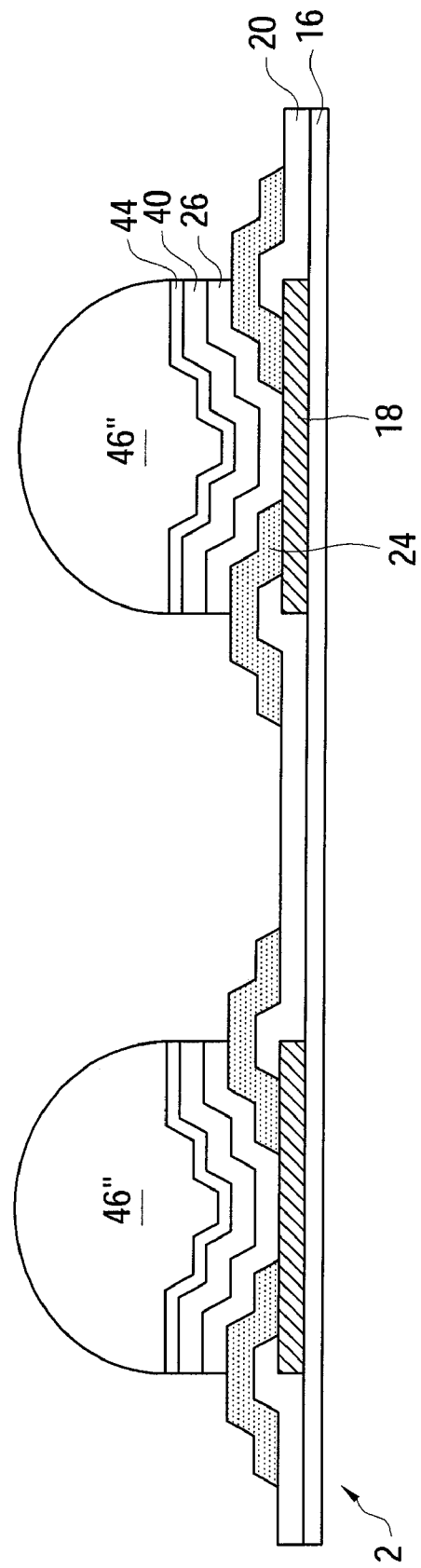

In additional alternative embodiments, the ring-shaped stress buffer layers 24 are utilized for solder bumps rather than Cu post bumps. FIGS. 8-9 are cross-sectional views of a portion of a semiconductor device at various stages of its fabrication according to an embodiment of the method 100 of FIG. 1. The explanation of the same or similar portions to the description in FIGS. 2-6 will be omitted.

Compared with the process as depicted in FIG. 5, the formation of the Cu post is replaced by a thin copper (Cu) layer in the solder bump process followed by the formation of a barrier layer and a solder layer. With reference to FIG. 8, after forming the mask layer 28 on the UBM layer 26, a thin Cu layer 40 is deposited on the UBM layer 26 in the openings 28a. The thin Cu layer 40 has a thickness relatively thinner than the Cu post 30. In some embodiments, the thin Cu layer 40 has a thickness less than 10 μm. In some embodiments, the thin Cu layer 40 has a thickness about 4-6 μm, although the thickness may be greater or smaller. The thin Cu layer formation methods may include sputtering, printing, electroplating, electroless plating, and chemical vapor deposition (CVD) methods.

A barrier layer 44, an optional layer, is then formed on the thin Cu layer 40 in the openings 28a. The barrier layer 44 may be made of copper, nickel (Ni), tin, tin-lead (SnPb), gold (Au), silver, palladium (Pd), indium (In), nickel-palladium-gold (NiPdAu), nickel-gold (NiAu), other similar materials, or alloys deposited by plating methods. The barrier layer 44 has a thickness less than 10 μm. In some embodiments, the barrier layer 44 has a thickness less than 5 μm. Next, a solder layer 46 is formed on the barrier layer 44 in the openings 28a. In one embodiment, the solder layer 46 is a lead-free solder layer. In some embodiments, the solder layer 46 is made of Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, or SnAgSb, etc., formed by plating processes. After removing the mask layer 28, followed by the UBM etching process, the solder layer 46 is reflowed as a solder ball. Therefore, the reflowed solder layer 46", the barrier layer 44 and the thin copper layer 40 are referred to as a solder bump structure.

Figure 10:
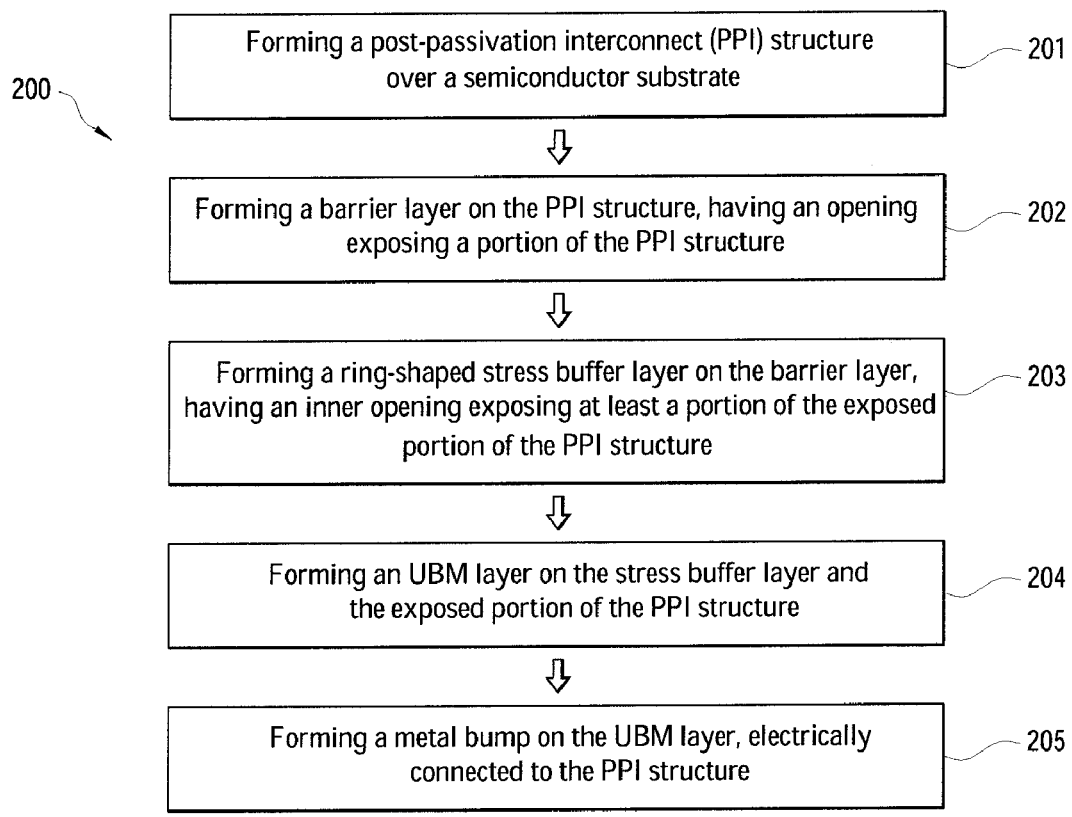
FIG. 10 is a flowchart of a method for fabricating a semiconductor device with a post-passivation interconnect (PPI) structure according to various aspects of the present disclosure.

In additional alternative embodiments, the ring-shaped stress buffer layers 24 are utilized for solder bumps located on post-passivation interconnect (PPI) structures. Illustrated in FIG. 10 is a flowchart of a method 200 for fabricating a semiconductor device according to various aspects of the present disclosure. Referring to FIG. 10, the method 200 begins with block 201 in which a PPI structure is formed over a semiconductor substrate. The method 200 continues with block 202 in which a barrier layer is formed on the PPI structure. The barrier layer is patterned to form an opening that exposes a portion of the PPI structure. The method 200 continues with block 203 in which a stress buffer layer is formed on the barrier layer. The stress buffer layer is patterned as a ring-shape layer with an inner opening that exposes at least a portion of the exposed portion of the PPI structure. The method 200 continues with block 204 in which an UBM layer is formed on the stress buffer layer and the exposed portion of the PPI structure. The method 200 continues with block 205 in which a metal bump is formed on the UBM layer so as to electrically connect the metal bump to the PPI structure.

FIGS. 11-14 are cross-sectional views of a portion of a semiconductor device at various stages of its fabrication according to an embodiment of the method 200 of FIG. 10. The explanation of the same or similar portions to the description in FIGS. 2-6 will be omitted.

Figure 11:
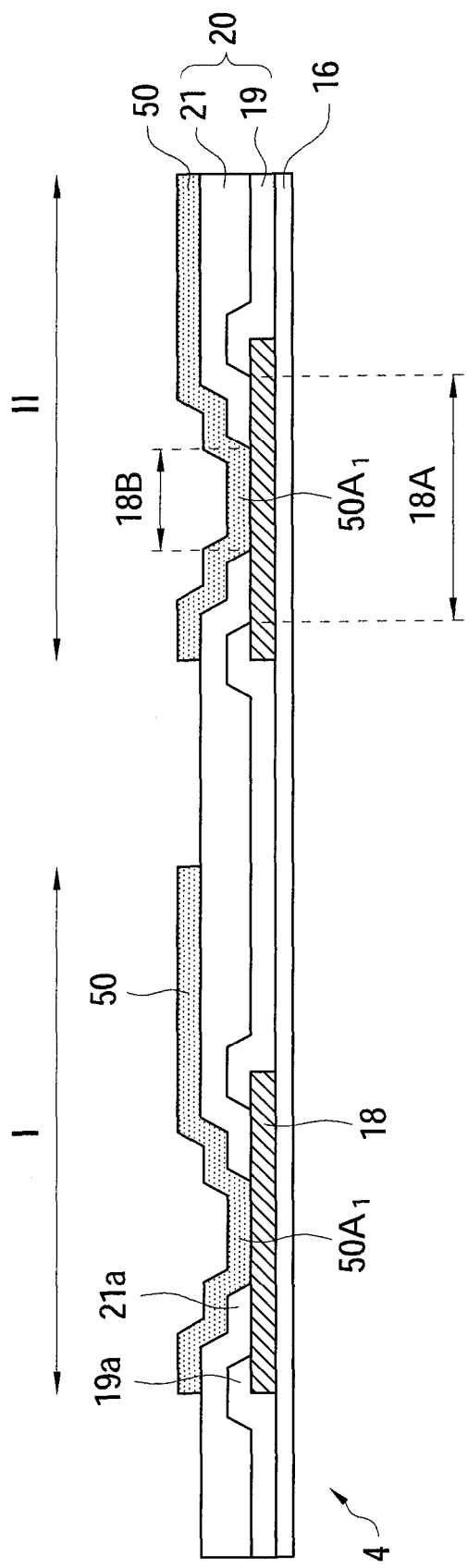
FIGS. 11-14 are cross-sectional views of a portion of a wafer at various stages of its fabrication according to an embodiment of the method of FIG. 10.

Compared with the process as depicted in FIG. 2, PPI structures are provided on the second passivation layer followed by the formation of the ring-shaped stress buffer layers. With reference to FIG. 11, the second passivation layer 20 is formed on a wafer 4 to expose the metal pads 18 located in different bump regions I and II. In some embodiments, the second passivation layer 20 includes a first layer 19 and a second layer 21. In one bump region I or II, the first layer 19 is formed on the first passivation layer 10 and patterned to form first openings 19a to expose a first portion 18a of the metal pad 18. The second layer 21 is formed on the first layer 19 and patterned to form a second opening 21a to expose a second portion 18b of the metal pad 18. The second portion 18b is formed within the first portion 18a. In some embodiments, the first layer 19 and the second layer 21 are formed of a non-organic material selected from un-doped silicate glass (USG), silicon nitride, silicon oxynitride, silicon oxide, or combinations thereof. In some embodiments, the first layer 19 and the second layer 21 are formed of a polymer, such as an epoxy, polyimide, benzocyclobutene (BCB), polybenzoxazole (PBO), and the like. The first layer 19 and the second layer 21 may be formed of the same material or different materials.

Next, a conductive material layer is deposited on the wafer 4, covering the second passivation layer 20 and contacting the exposed portion 18b of the metal pad 18. The conductive material layer is then patterned to become interconnect lines 50 arranged in bump regions I and II. In one bump region I or II, the PPI line 50 includes a first end $50A_1$ electrically connected to the metal pad 18, and a second end $50A_2$ which will be electrically connected to an UBM layer and a metal bump formed in subsequent processes. The PPI line 50 includes, but is not limited to, for example copper, aluminum, copper alloy, or other mobile, conductive materials. In some embodiments, the PPI line 50 may further include a nickel-containing layer (not shown) on top of a copper-containing layer. The PPI formation methods include plating, electroless plating, sputtering, chemical vapor deposition methods, and the like. The PPI line 50 may also function as power lines, re-distribution lines (RDL), inductors, capacitors or any passive components. The PPI line 50 may have a thickness less than about 30 μm, for example between about 2 μm and about 25 μm.

Figure 12:
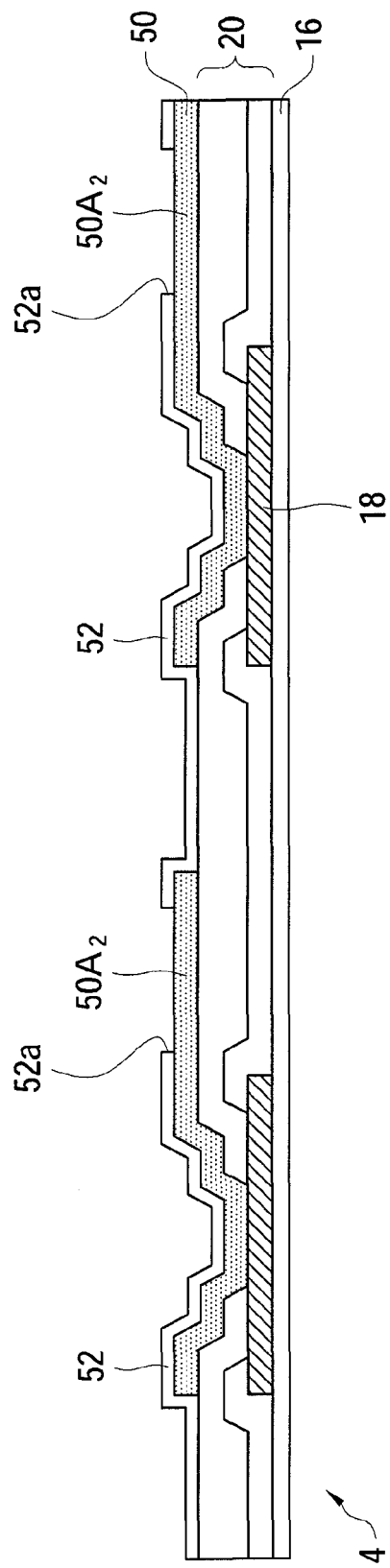

With reference to FIG. 12, a barrier layer 52 is then formed on the wafer 4 to cover the PPI lines 50 and the exposed portions of the second passivation layer 20. Using photolithography and etching processes, the barrier layer 52 is further patterned to form openings 52a exposing the second ends $50A_2$ of the PPI lines 50 respectively. In some embodiments, the barrier layer 52 is formed of a non-organic material selected from un-doped silicate glass (USG), silicon nitride, silicon oxynitride, silicon oxide, and combinations thereof. In some embodiments, the barrier layer 52 is formed of a polymer layer, such as an epoxy, polyimide, benzocyclobutene (BCB), polybenzoxazole (PBO), and the like, although other relatively soft, often organic, dielectric materials may also be used.

Figure 13:
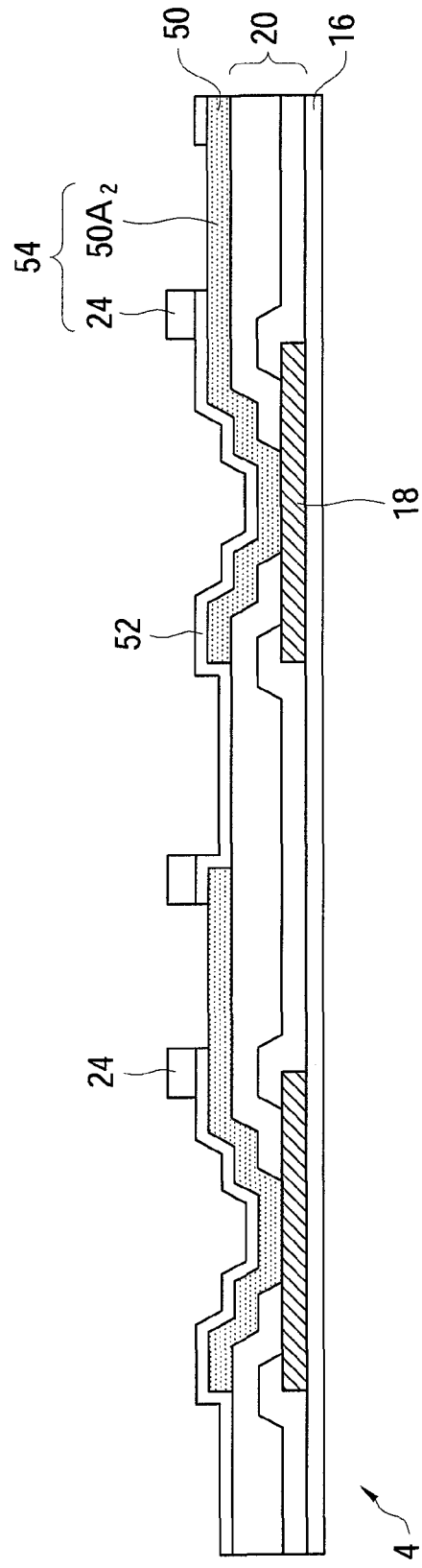

Next, as shown in FIG. 13, a plurality of ring-shaped stress buffer layers 24 is formed on the barrier layer 52 in bump regions I and II. The stress buffer layers 24 are separated from each other. In one bump region I or II, the stress buffer layer 24 covers a portion of the barrier layer 52, and exposes at least a portion of the second end $50A_2$ of the PPI line 50. The inner opening 24a of the stress buffer layer 24 may be smaller than, larger than or equal to the opening 52a of the barrier layer 52. In one bump region, the combination of the second end $50A_2$ of the PPI line 50 and the stress buffer layer 24 serves as a pad structure 54 for electrically connecting an external terminal. The stress buffer layer 24 can be any geometric ring-shaped layer. In some embodiments, the stress buffer layers 24 are formed of circular rings. In some embodiments, the stress buffer layers 24 are formed of square rings. In some embodiments, the stress buffer layers 24 are formed of octagonal rings. Combinations of shapes on the same wafer, e.g., a wafer containing ring, square and polygonal ring-shaped stress buffer layers, are possible in further embodiments. The ring-shaped stress buffer layers 24 may extend several microns or tens of microns from the edge of the barrier layer 52.

Figure 14:
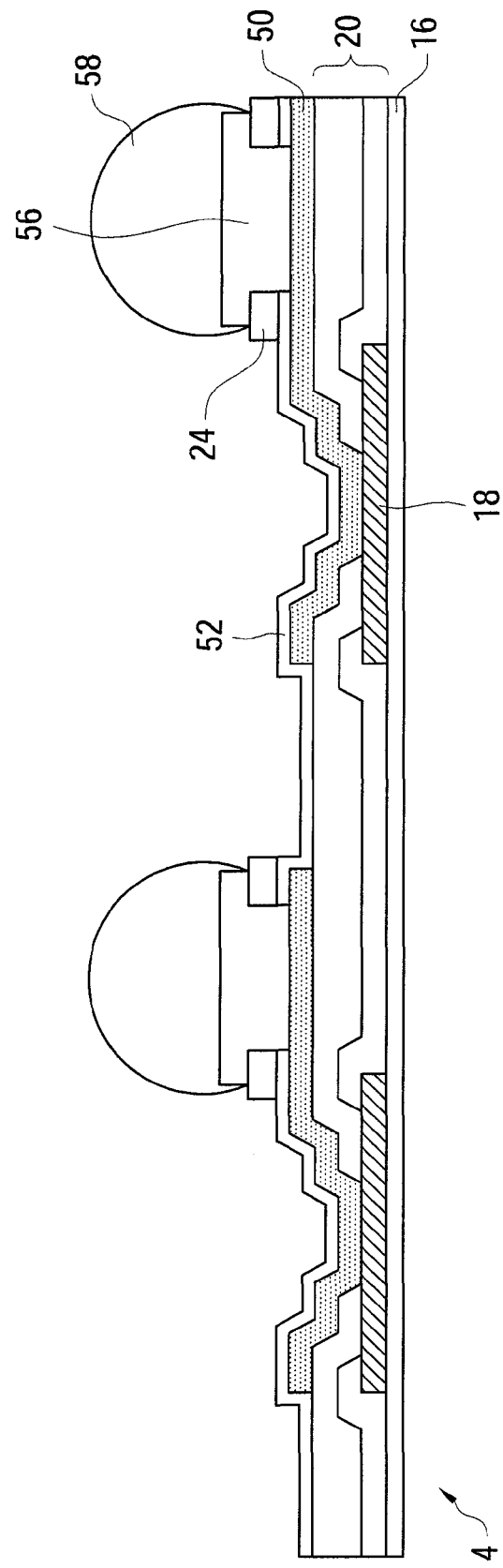

Thereafter, with reference to FIG. 14, an under-bump-metallurgy (UBM) layer 56 and a solder ball 58 are formed on the ring-shaped stress buffer layer 24 and the exposed portion of the PPI line 50 in one bump region using bump formation methods including UBM deposition, masking processes, thin copper layer deposition, solder layer deposition, mask stripping processes, UBM etching processes, and solder reflow processes. In additional alternative embodiments, Cu post bumps are utilized on the PPI lines 50 rather than solder bumps. The wafer 4 is then sawed and packaged onto a package substrate, or another die, with solder balls or Cu bumps mounted on a pad on the package substrate or the other die.

In the preceding detailed description, the disclosure is described with reference to specific exemplary embodiments thereof. It will, however, be evident that various modifications, structures, processes, and changes may be made thereto without departing from the broader spirit and scope of the disclosure. The specification and drawings are, accordingly, to be regarded as illustrative and not restrictive. It is understood that the disclosure is capable of using various other combinations and environments and is capable of changes or modifications within the scope of inventive concepts as expressed herein.

What is claimed is:

1. A semiconductor device, comprising:
a metal pad overlying a semiconductor substrate;
a passivation layer overlying the metal pad, the passivation layer covering an edge portion of the metal pad and exposing a first portion of the metal pad;
a ring-shaped layer overlying the passivation layer and the metal pad, the ring-shaped layer covering an edge portion of the passivation layer and exposing a second portion of the metal pad, wherein the second portion of the metal pad is within the first portion of the metal pad;
an under-bump metallization (UBM) layer overlying the ring-shaped layer and electrically connected to the second portion of the metal pad; and
a metal bump overlying the UBM layer.

2. The semiconductor device of claim 1, wherein the ring-shaped layer comprises a polymer layer.

3. The semiconductor device of claim 1, wherein the ring-shaped layer comprises a dielectric layer with a dielectric constant less than 3.5.

4. The semiconductor device of claim 1, wherein the ring-shaped layer comprises at least one of an aluminum layer and a copper layer.

5. The semiconductor device of claim 1, wherein the ring-shaped layer extends a distance of about 5-15 µm from the edge of the UBM layer.

6. The semiconductor device of claim 1, wherein the metal bump comprises a copper post.

7. The semiconductor device of claim 6, wherein the metal bump further comprises a cap layer on the copper post, and a solder layer on the cap layer.

8. The semiconductor device of claim 7, wherein the cap layer comprises nickel, and the solder layer comprises a lead-free solder layer.

9. The semiconductor device of claim 1, wherein the metal bump comprises a copper layer and a solder ball overlying the copper layer.

10. The semiconductor device of claim 1, wherein the ring-shaped layer comprises at least one of a circular ring, a square ring, and an octagonal ring.

11. A semiconductor device, comprising:
a metal pad overlying a semiconductor substrate;
a passivation layer overlying the metal pad and exposing a portion of the metal pad;
an interconnect line overlying the passivation layer and electrically connected to the exposed portion of the metal pad;
a barrier layer overlying the interconnect line and exposing a portion of the interconnect line;
a ring-shaped layer overlying the barrier layer and electrically connected to the exposed portion of the interconnect line,
an under-bump metallization (UBM) layer overlying the ring-shaped layer and electrically connected to the exposed portion of the interconnect line; and
a bump overlying the UBM layer.

12. The semiconductor device of claim 11, wherein the ring-shaped layer comprises a polymer layer.

13. The semiconductor device of claim 11, wherein the ring-shaped layer comprises a dielectric layer with a dielectric constant less than 3.5.

14. The semiconductor device of claim 11, wherein the ring-shaped layer comprises at least one of an aluminum layer and a copper layer.

15. The semiconductor device of claim 11, wherein the bump comprises a copper layer and a solder ball overlying the copper layer.

16. The semiconductor device of claim 11, wherein the ring-shaped layer comprises at least one of a circular ring, a square ring, and an octagonal ring.

17. A process, comprising:
providing a semiconductor substrate having a conductive region;
forming a dielectric layer overlying the semiconductor substrate;
forming a first opening in the dielectric layer to expose a portion of the conductive region;
forming a ring-shaped layer overlying the dielectric layer, exposing at least a portion of the exposed portion of the conductive region;
forming an under-bump metallization (UBM) layer overlying the ring-shaped layer, the dielectric layer and the conductive region;
forming a mask layer with a second opening overlying the UBM layer;
forming a conductive material layer in the second opening of the mask layer, the conductive material layer electrically connected to the UBM layer; and
removing the mask layer.

18. The process of claim 17, wherein the ring-shaped layer comprises a polymer layer.

19. The semiconductor device of claim 17, wherein the ring-shaped layer comprises a dielectric layer has a dielectric constant less than 3.5.

20. The semiconductor device of claim 17, wherein the ring-shaped layer comprises at least one of an aluminum layer and a copper layer.

* * * * *